United States Patent
Donze et al.

(10) Patent No.: US 7,916,526 B2
(45) Date of Patent: Mar. 29, 2011

(54) PROTECTION REGISTER FOR A PHASE-CHANGE MEMORY

(75) Inventors: Enzo Michele Donze, San Giuseppe Jato (IT); Salvatore Polizzi, Palermo (IT); Greg Komoto, Sacramento, CA (US)

(73) Assignee: STMicroelectronics S.r.l., Agrate Brianza (IT)

( * ) Notice: Subject to any disclaimer, the term of this patent is extended or adjusted under 35 U.S.C. 154(b) by 143 days.

(21) Appl. No.: 12/346,504

(22) Filed: Dec. 30, 2008

(65) Prior Publication Data

US 2010/0165715 A1    Jul. 1, 2010

(51) Int. Cl.
*G11C 11/00* (2006.01)
(52) U.S. Cl. .......... 365/163; 365/148; 365/228
(58) Field of Classification Search .......... 365/163, 365/113, 148, 189.12, 195, 200, 228
See application file for complete search history.

(56) References Cited

U.S. PATENT DOCUMENTS

| | | | |
|---|---|---|---|
| 5,901,326 A * | 5/1999 | Gildea et al. | 710/5 |
| 5,930,826 A * | 7/1999 | Lee et al. | 711/163 |
| 2004/0179394 A1 * | 9/2004 | Ovshinsky et al. | 365/163 |
| 2010/0165765 A1 * | 7/2010 | Yu et al. | 365/200 |

OTHER PUBLICATIONS

U.S. Appl. No. 12/346,701, filed Dec. 30, 2008, to Chin-Tin Tina Yu et al.

* cited by examiner

*Primary Examiner* — Gene N. Auduong
(74) *Attorney, Agent, or Firm* — Lisa K. Jorgenson; Jeremiah J. Baunach; Seed IP Law Group PLLC

(57) ABSTRACT

A memory device including a memory array comprising a set of phase change memory cells configured to store data. The memory device further includes a protection register including a set of protection cells configured to store protection information of the memory cells. The protection cells of the protection register are memory cells of the memory array.

33 Claims, 2 Drawing Sheets

PROTECTION REGISTER FOR A PHASE-CHANGE MEMORY

BACKGROUND

1. Technical Field

The present disclosure relates to the integrated memories field. Specifically, the present disclosure relates to a non-volatile memory device; more particularly, the present disclosure regards a phase change memory device.

2. Description of the Related Art

Non-volatile memory is a type of memory that can retain the stored information even when not powered. Just to mention a few examples, known semiconductor non-volatile memories include erasable and programmable read-only memories, flash memories, and phase change memories. In such types of memory the information is stored in memory cells arranged in one or more memory arrays.

The memory cells of a memory array are arranged in rows and columns, wherein each row contains a number of memory cells that represent a number of bytes. Typically, the memory arrays are arranged so that a number of rows are then grouped into sectors in which each sector contains thousands of bytes (kilobytes). In some cases, the size of the sectors of a memory array may vary from one another.

For example, an 8 megabit flash memory device may incorporate a sector arrangement of a single 32 kilobyte sector, eight 4 kilobyte sectors, a single 64 kilobyte sector, and seven 128 kilobyte sectors. In this exemplary arrangement, the first sector in the array—the 32 kilobyte sector—may be allocated to store boot code, while the smaller 4 kilobyte sectors may be allocated for configuration data and parameter storage. Some of the larger sectors in the array may be used to store the system's main program code with the remaining sectors allocated for user data storage.

In order to increase the reliability of said devices, it is desirable to protect some of these sectors against unintentional or malicious program and erase operations. In the example described above, the sectors storing the boot code, the configuration data, and the main program code would most likely need to be protected. If any of these sectors were to be inadvertently erased or programmed with erroneous information, then the system would not function properly.

For this purpose, modern non-volatile memory devices are provided with so called protection registers. A protection register is a dedicated memory register that may be used for storing information regarding the protection of the data memorized in the various sectors of the memory device. For example, each sector of a memory array may be associated with a corresponding protection bit stored in the protection register, whose value determines whether the memory cells of said sector can be programmed (and erased) or not. In this way, the information stored in the memory cells of a sector whose corresponding protection bit indicates that said sector is "locked" can be efficiently protected against accidental (or unauthorized) alterations.

According to a solution known in the art, the protection registers are implemented by means of storage elements, referred to as protection memory cells, which are arranged in a dedicated mini-array separated from the other memory arrays of the device. A mini-array of such type is provided with a dedicated read circuit configured to interpret the protection bits stored in the protection memory cells for accordingly driving the program circuits of the memory arrays in such a way to allow or deny any programming (or erasing) operation directed to the memory cells thereof; in order to allow the selective alteration of the protection given to the various sectors, such mini-array may be provided with a dedicated program circuit that allows to change the values of the protection bits. However, this solution is disadvantageous, because the area required for integrating such mini-arrays and the dedicated read and program circuits in the chip wherein the memory is integrated is not negligible.

For these reasons, in most flash memory devices the protection registers are preferably implemented using memory cells that belong to the memory arrays instead of using a dedicated mini-array. Indeed, by using standard memory cells as protection memory cells, it is not necessary to provide for dedicated read and program circuits for the protection register, since the protection memory cells can be read and programmed using the read and program circuits of the memory arrays.

However, this solution suffers from a major drawback which strictly depends on the major limitation affecting the flash memory devices: as it is well known to those skilled in the art, although a flash memory can be read or programmed a byte or a word at a time in a random access fashion, it must be erased a "block" at a time, wherein with the term "block" it is intended a group of memory cells which are realized in a same well, and thus that share a common bulk. For example, one of such blocks of memory cells may correspond to an entire sector, or a portion thereof. An erasing operation sets all the memory cells of a block to an erased condition, for example corresponding to a logic "1". Starting with a freshly erased block, any memory cell within that block can be programmed, for example to a logic "0". However, once a memory cell has been set to "0", only by erasing the entire block can it be changed back to "1". Thus, by using the standard memory cells of a flash memory array as protection memory cells, it is not possible to selectively modify the protection given to a single sector without having to erase the whole block to which the protection memory cells belong.

BRIEF SUMMARY

In view of the above the Applicant has tackled the problem of improving the known solutions for implementing protection registers for non-volatile memories.

One embodiment provides a memory device including a memory array comprising a set of phase change memory cells configured to store data. The memory device further includes a protection register including a set of protection cells configured to store protection information of the memory cells. The protection cells of the protection register are memory cells of the memory array.

One embodiment provides a corresponding method.

One embodiment provides an electronic system including at least one non-volatile memory.

BRIEF DESCRIPTION OF THE SEVERAL VIEWS OF THE DRAWINGS

The invention itself, as well as further features and the advantages thereof, will be best understood with reference to the following detailed description, given purely by way of a non-restrictive indication, to be read in conjunction with the accompanying drawings. Particularly.

DETAILED DESCRIPTION

In the following, a solution according to exemplary and non-limitative embodiments will be presented and described in detail. Those skilled in the art will however recognize that several modifications to the described embodiments are possible.

Figure 1:
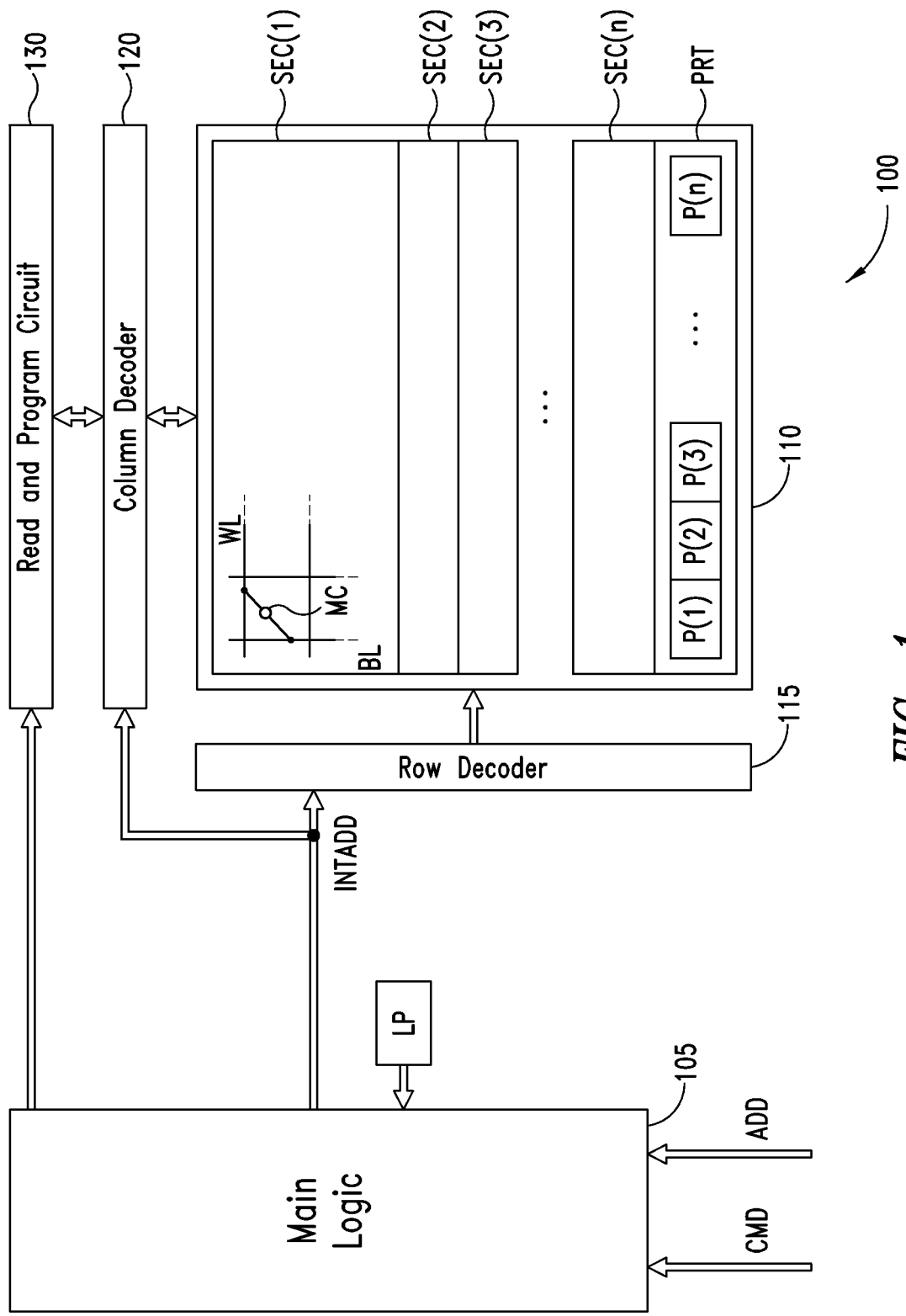
FIG. 1 schematically illustrates a non-volatile memory according to an embodiment.

FIG. 1 schematically illustrates a non-volatile memory 100 according to an embodiment.

The non-volatile memory 100 comprises a main logic block 105 and a memory array 110 comprising a plurality of non-volatile memory cells MC arranged in rows and columns. The memory 100 includes a plurality of bit lines BL, each one associated with a column of the memory array 110, and a plurality of word lines WL, each one associated with a row of the memory array 110.

The main logic block 105 is configured to manage operations to be performed on the memory cells of the memory array 110 in response to commands CMD and addresses ADD received from the outside of the memory. Without descending to particulars well known in the art, the main logic block 105 is configured to receive the commands CMD and accordingly determine an operation (for example, a reading or a programming operation) to be performed on selected memory cells of the memory array 110 identified by the specific address ADD.

In response to the received address ADD, the main logic block 105 generates an internal address INTADD (this process will be better described in the following of the present description); the internal address INTADD is sent to a row decoder 115 and to a column decoder 120, which accordingly select one word line WL and a group of bit lines BL, respectively.

Moreover, the main logic block 105 is coupled with a read and program circuit 130 including all the components (such as sense amplifiers, comparators, charge pumps, reference cells, pulse generators, and the like) which are used to program the memory cells MC, or to read their values. Particularly, based on the received command CMD, the main logic block 105 drives said read and program circuit 130 for performing a reading or a programming operation on the memory cells MC associated with the selected word lines WL and bit lines BL.

The memory 100 is a phase change memory, wherein each memory cell MC is made of a phase change material; typically, the phase change material consists of a chalcogenide (such as an alloy $Ge_2Sb_2Te_5$). Without descending to particulars well known in the art, the phase change material can be reversibly switched between a generally amorphous, disordered phase and a generally crystalline, high ordered phase. The two phases of the material exhibit different electrical characteristics; particularly, the material in the amorphous phase has a high resistivity (defining a reset state associated with a first logic value, for example, "0"), whereas the material in the crystalline phase has a low resistivity (defining a set state associated with a second logic value, for example, "1"). It has to be appreciated that the present invention is in no way limited to the phase change memories, the concept thereof being applicable to any non-volatile memory.

The memory array 110 is arranged into a plurality of n sectors SEC(i) (i=1 to n) each one comprising a respective group of memory cells MC. For example, each sector SEC(i) may include the memory cells MC associated with a respective group of word lines WL. The number of memory cells MC included in the sectors SEC(i) may vary from one another.

According to an embodiment, a portion of the memory array 110—referred to as "protection portion" and identified in the figure with the reference PRT—is exploited as a protection register. For example, the protection portion PRT may be a portion of the memory array corresponding to the memory cells MC associated with a specific word line WL.

The memory cells MC of the protection portion PRT are used to store protection information of the data memorized in the various sectors SEC(i) of the memory array 110. In detail, each sector SEC(i) of the memory array 110 is associated with a corresponding protection bit P(i) stored in a corresponding memory cell MC of the protection portion PRT. The value of each protection bit P(i) determines whether the memory cells MC of the associated sector SEC(i) can be programmed (and erased) or not. If a protection bit P(i) is at a first logic value (e.g., "1"), the corresponding sector SEC(i) is in a "locked" condition, i.e., the memory cells MC belonging to that sector SEC(i) cannot be subjected to program operations, so that the data stored therein cannot be modified. On the other hand, if a protection bit P(i) is at a second logic value (e.g., "0"), the corresponding sector SEC(i) is in an "unlocked" condition, i.e., the memory cells MC belonging to that sector SEC(i) can be freely programmed, and the data stored therein can be modified.

In the following will be described how the non-volatile memory 100 operates according to an embodiment during reading and writing operations directed to the memory cells MC of the memory array 110 and during operations directed to modify the protection information stored in the protection portion PRT.

When the command CMD received by the main logic block 105 is indicative of a reading operation that has to be performed on a group of memory cells MC identified by the address ADD, the main logic block 105 generates an internal address INTADD corresponding to said address ADD; then, said internal address INTADD is provided to the row decoder 115 and to the column decoder 120, for selecting a word line WL and a group of bit lines BL, respectively. Then, the addressed memory cells MC corresponding to the selected word line WL and to the selected bit lines BL are connected to the read and program circuit 130, and the data stored therein is read.

When the command CMD received by the main logic block 105 is indicative of a programming operation that has to be performed on a group of memory cells MC identified by the address ADD, the main logic block 105 firstly checks whether said address ADD corresponds to memory cells MC belonging to a "locked" sector SEC(i) or to memory cells MC belonging to an "unlocked" sector SEC(i). For this purpose, based on the received address ADD, the main logic block 105 is capable of identifying the sector SEC(i) of the memory array 110 comprising the addressed memory cells MC; for example, each sector SEC(i) may be identified through the value assumed by a respective portion of the address ADD. Once the sector SEC(i) comprising the addressed memory cells MC has been identified, the main logic block may access the protection portion PRT of the memory array 110 by generating an internal address INTADD corresponding to the protection bit P(i) of said sector SEC(i). In the same way as previously described, the memory cell MC storing the protection bit P(i) is read through the read and program circuit 130. If the protection bit P(i) is indicative of a "locked" condition, the writing operation is not accomplished; on the contrary, if the protection bit P(i) is indicative of an "unlocked" condition, the addressed memory cells MC can be accessed for being programmed. In the latter case, an internal address INTADD corresponding to the address ADD is provided to the row decoder 115 and to the column decoder 120, for selecting a word line WL and a group of bit lines BL, respectively. Then, the addressed memory cells MC corresponding to the selected word line WL and to the selected bit lines BL are connected to the read and program circuit 130 for being programmed.

Specific commands CMD may be sent to the main logic block 105 for modifying the protection information stored in the protection portion PRT. Particularly, the main logic block 105 may be instructed through a specific command CMD to change the protection condition of a selected sector SEC(i) of the memory array 110. For example, a command CMD may request that a sector SEC(i) in a "locked" condition is brought to an "unlocked" condition, or vice versa. In the former case, the corresponding protection bit P(i) has to be brought from the value indicative of a "locked" condition (e.g., "1"), to the value indicative of an "unlocked" condition (e.g., "0"); in the latter case, the corresponding protection bit P(i) has to be brought from the value indicative of an "unlocked" condition (e.g., "0"), to the value indicative of a "locked" condition (e.g., "1"). For this purpose, the main logic block 105 generates an internal address INTADD corresponding to the protection bit P(i) of the sector SEC(i) specified in the command CMD; then, the memory cell MC storing said protection bit P(i) is selectively connected to the read and program circuit 130 for being accordingly programmed.

It has to be appreciated that since the memory cells MC of the memory array 110 are of the phase change type, and thus they can be programmed individually, it is possible to selectively change a single protection bit P(i) without occurring in the drawbacks mentioned in the introduction of the present description. Indeed, with the proposed solution, a single protection bit P(i) stored in the protection portion PRT of the memory array 110 may be modified without having to perform first an erase operation regarding a block of memory cells MC, as required instead in a flash memory. Thus, by implementing a protection register according to the proposed solution it is possible to manage the protection of the various sectors of a phase change memory in a very flexible and reliable way.

According to an embodiment, the protection of the data stored in the memory array 110 may be further improved by providing the possibility of bringing the protection portion PRT itself into a permanent "locked" condition, wherein the values of the protection bits P(i) cannot be modified any longer. In this way, once the protection portion PRT has been permanently locked, the protection information regarding the data memorized in the various sectors SEC(i) of the memory array 110 cannot be modified.

For this purpose, the non-volatile memory 100 may include a protection locking element LP which can be set for bringing the protection portion PRT into the "locked" condition. According to an embodiment, the protection locking element LP is a one-time programmable memory element, such as a memory cell provided with a fuse element configured to be permanently fused so that the programming of the data stored therein is irreversible. The protection locking element LP may be accessed by the main logic block 105 so as to determine whether the protection portion PRT is in a "locked" condition or in an "unlocked" condition.

The protection bits P(i) stored in the protection portion PRT may be freely modified as previously described until the protection locking element LP is programmed. Particularly, once the protection locking element LP has been programmed, any command CMD sent to the main logic block 105 for modifying the protection information stored in the protection portion PRT is ignored. Thus, with this arrangement, it is possible to firstly configure the sectors SECT(i) to be protected by programming the protection portion PRT, and then locking said configuration by programming the protection locking element LP.

It has to be noted that the concepts of the present disclosure can be applied even if the protection locking elements LP is implemented in a different way. For example, the protection locking element LP may be a particular memory cell MC of the array 110, for example belonging to the protection portion PRT, which is associated with a specific internal address INTADD that can be acknowledged by the main logic block 105.

Figure 2:
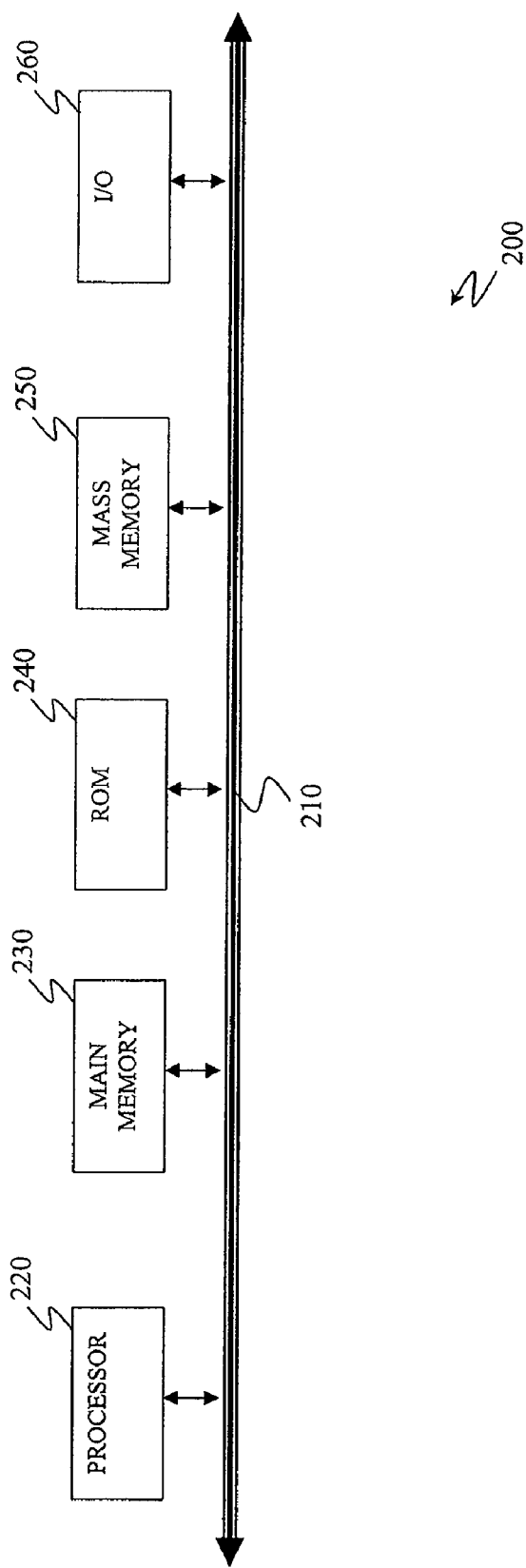
FIG. 2 schematically illustrates a portion of an exemplary electronic system according to one embodiment.

FIG. 2 schematically illustrates a portion of an exemplary electronic system 200 according to an embodiment. The electronic system 200 may be for example a computer, a personal digital assistant (PDA), a laptop or portable computer, a digital music player, a digital camera, or other devices that may be configured to exploit an integrated non-volatile memory device.

The electronic system 200 is formed by several units that are connected in parallel to a system or communication bus 210 (with a structure that is suitably scaled according to the actual function of the system 200). In detail, one or more processors 220 control operation of the system 200; a main memory 230 is directly used as a working memory by the processors 220, and a ROM 240 stores basic code for a bootstrap of the system 200. Moreover, the system 200 is provided with a mass memory 250 for storing data and programs, and input/output units 260 for receiving/providing data from/to the outside.

The system 200 may exploit the advantages of the proposed solution by implementing the ROM 240 and/or the mass memory 250 with at least one non-volatile memory device such as the memory device 100 discussed herein.

Naturally, a person skilled in the art may apply to the solution described above many logical and/or physical modifications and alterations. More specifically, although the present disclosure describes with a certain degree of particularity some embodiment, it should be understood that various omissions, substitutions and changes in the form and details as well as other embodiments are possible. Particularly, the proposed solution may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any disclosed embodiment may be incorporated in any other embodiment as a matter of general design choice.

The invention claimed is:

1. A memory device, comprising:
   a memory array including a set of phase change memory cells configured to store data; and
   a protection register including a set of protection cells configured to store protection information of the memory cells, wherein the protection cells of the protection register are phase change memory cells of the memory array.

2. The memory device of claim 1, further including a program circuit configured to modify the data stored in selected memory cells of the set of phase change memory cells, and a control circuit configured to condition a modification of the data stored in the selected memory cells by the program circuit based on the protection information.

3. The memory device of claim 2, wherein:
   the memory array comprises at least one sector of memory cells, the protection register including a respective protection indicator for each sector; and
   the control circuit is configured to enable the modification of the data stored in the selected memory cells according to the protection indicator of the corresponding sector.

4. The memory device of claim 3, wherein the control circuit is configured to:
enable the modification of the data stored in the selected memory cells if the protection indicator of the corresponding sector is at a first value, and
prevent the modification of the data stored in the selected memory cells if the protection indicator of the corresponding sector is at a second value.

5. The memory device of claim 4, wherein each protection indicator is stored in a respective protection cell of the protection register.

6. The memory device of claim 5, wherein the program circuit is further configured to modify the protection indicators stored in selected protection cells.

7. The memory device of claim 6, wherein the program circuit is configured to individually access each protection cell of the protection register for modifying the protection indicator stored therein.

8. The memory device of claim 7, further including a locking element configured to store a locking indicator, the control circuit being configured to enable modification of the protection indicators stored in the protection cells according to the locking indicator.

9. The memory device of claim 8, wherein the locking element is a one-time programmable memory element.

10. The memory device of claim 1, further comprising a column decoder configured to access the memory cells of the memory array, including the memory cells of the protection register.

11. The memory device of claim 1, further comprising a row decoder configured to access the memory cells of the memory array, including the memory cells of the protection register.

12. A method for managing a memory device, comprising:
storing data into a set of phase change memory cells forming a memory array;
storing protection information of the memory cells into a set of protection cells forming a protection register, wherein the protection cells of the protection register are phase change memory cells of the memory array.

13. The method of claim 12, further including:
modifying the data stored in selected memory cells of the set of phase change memory cells, and
conditioning a modification of the data stored in the selected memory cells based on the protection information.

14. The method of claim 13, wherein the memory array comprises at least one sector of memory cells, the protection register including a respective protection indicator for each sector; the method including enabling the modification of the data stored in the selected memory cells according to the protection indicator of the corresponding sector.

15. The method of claim 14, further including:
enabling the modification of the data stored in the selected memory cell if the protection indicator of the corresponding sector is at a first value, and
preventing the modification of the data stored in the selected memory cell if the protection indicator of the corresponding sector is at a second value.

16. The method of claim 15, wherein each protection indicator is stored in a respective protection cell of the protection register.

17. The method of claim 16, further including modifying the protection indicators stored in selected protection cells.

18. The method of claim 17, further including individually accessing each protection cell of the protection register for modifying the protection indicator stored therein.

19. The method of claim 18, further including storing a locking indicator into a locking element and enabling modification of the protection indicators stored in the protection cells according to the locking indicator.

20. The method of claim 19, wherein the locking element is a one-time programmable memory element.

21. An electronic system, comprising:
a processor;
input/output units for receiving and providing data; and
a memory that includes:
a memory array including a set of phase change memory cells configured to store data;
a protection register including a set of protection cells configured to store protection information of the memory cells, wherein the protection cells of the protection register are phase change memory cells of the memory array.

22. The system of claim 21, further including a program circuit configured to modify the data stored in selected memory cells of the set of phase change memory cells, and a control circuit configured to condition a modification of the data stored in the selected memory cells by the program circuit based on the protection information.

23. The system of claim 22, wherein:
the memory array comprises at least one sector of memory cells, the protection register including a respective protection indicator for each sector; and
the control circuit is configured to enable the modification of the data stored in the selected memory cells according to the protection indicator of the corresponding sector.

24. The system of claim 23, wherein the control circuit is configured to:
enable the modification of the data stored in the selected memory cell if the protection indicator of the corresponding sector is at a first value, and
prevent the modification of the data stored in the selected memory cell if the protection indicator of the corresponding sector is at a second value.

25. The system of claim 24, wherein each protection indicator is stored in a respective protection cell of the protection register.

26. The system of claim 25, wherein the program circuit is further configured to modify the protection indicators stored in selected protection cells.

27. The system of claim 26, wherein the program circuit is configured to individually access each protection cell of the protection register for modifying the protection indicator stored therein.

28. The system of claim 27, further including a locking element configured to store a locking indicator, the control circuit being configured to enable a modification of the protection indicators stored in the protection cells according to the locking indicator.

29. The system of claim 28, wherein the locking element is a one-time programmable memory element.

30. A memory device, comprising:
a memory controller; and
a memory array coupled to the memory controller and configured to be controlled by the memory controller, the memory array including:
a set of phase change memory cells configured to store data; and
a protection register including a set of protection cells configured to store protection information of the memory cells, wherein the protection cells of the protection register are phase change memory cells of the memory array.

31. The memory device of claim 30, further including a program circuit configured to modify the data stored in selected memory cells of the set of phase change memory cells.

32. The memory device of claim 31, wherein:
the memory array comprises at least one sector of memory cells, the protection register including a respective protection indicator for each sector; and
the memory controller is configured to enable the modification of the data stored in the selected memory cells according to the protection indicator of the corresponding sector.

33. The memory device of claim 32, wherein the memory controller is configured to:
enable the modification of the data stored in the selected memory cells if the protection indicator of the corresponding sector is at a first value, and
prevent the modification of the data stored in the selected memory cells if the protection indicator of the corresponding sector is at a second value.

* * * * *